United States Patent
Cooper et al.

[11] Patent Number: 6,063,205
[45] Date of Patent: May 16, 2000

[54] USE OF $H_2O_2$ SOLUTION AS A METHOD OF POST LAP CLEANING

[76] Inventors: Steven P. Cooper, 27412 NE. 197th Ave., Battle Ground, Wash. 98604; Michito Sato, 16903 SE. 28th St., Vancouver, Wash. 98683

[21] Appl. No.: 09/015,045

[22] Filed: Jan. 28, 1998

[51] Int. Cl.[7] .............................. C03C 23/00; C23G 1/00
[52] U.S. Cl. .................................................. 134/2; 510/175
[58] Field of Search .............................. 134/2; 438/626; 510/175

[56] References Cited

U.S. PATENT DOCUMENTS

| | | | |
|---|---|---|---|
| 3,383,319 | 5/1968 | Black | 252/95 |
| 3,471,341 | 10/1969 | Roach | 148/186 |
| 4,956,313 | 9/1990 | Cote et al. | 216/18 |
| 5,049,200 | 9/1991 | Brunner et al. | 134/2 |
| 5,196,134 | 3/1993 | Jackson | 252/103 |
| 5,302,311 | 4/1994 | Sugihara et al. | 510/175 |
| 5,389,194 | 2/1995 | Rostoker et al. | 156/636 |
| 5,397,397 | 3/1995 | Awad | 134/1 |
| 5,478,436 | 12/1995 | Winebarger et al. | 438/693 |
| 5,580,846 | 12/1996 | Hayashida et al. | 10/272 |
| 5,773,360 | 6/1998 | Chang et al. | 438/626 |
| 5,830,280 | 11/1998 | Sato et al. | 134/2 |
| 5,837,662 | 11/1998 | Chai et al. | 510/175 |
| 5,876,508 | 3/1999 | Wu et al. | 134/2 |

FOREIGN PATENT DOCUMENTS

| | | | |
|---|---|---|---|
| 651253 | 6/1993 | Australia | 134/2 |
| 55-82466 | 6/1980 | Japan | 134/2 |
| 6-41770 | 2/1994 | Japan | 134/2 |

OTHER PUBLICATIONS

Kern, Handbook of Semiconductor Wafer Cleaning Technology, 1993, p. 131.

*Primary Examiner*—Randy Gulakowski
*Assistant Examiner*—Yolanda E. Wilkins

[57] ABSTRACT

A method for post lapping cleaning of silicon wafers wherein the lapped wafer surfaces are cleaned and passivated by being treated with an aqueous hydrogen peroxide solution of about 0.5 to 2% by weight of hydrogen peroxide and then dried.

21 Claims, No Drawings

USE OF H₂O₂ SOLUTION AS A METHOD OF POST LAP CLEANING

BACKGROUND OF THE INVENTION

The present invention relates to the manufacture of high-purity silicon wafers used in the production of integrated circuit devices, and in particular, to a method of cleaning and oxidizing the surface of silicon wafers after lapping thereof.

In the manufacture of silicon wafers, wafer blanks are first cut from an ingot of high purity silicon. The wafers are subsequently lapped by rotating disks and a liquid-born abrasive such as an aqueous slurry of finely divided $Al_2O_3$. After lapping, the wafers are cleaned to remove residual lapping solution and silica from the lapped surface of the wafer. The wafers are then laser marked, cleaned again with alkali, acid etched, pre-washed for annealing, annealed, and finally polished to a mirror finish. In some instances, wafers may be sandblasted and washed immediately after acid etching and before the pre-wash for annealing steps. Each of these steps is well-known to those of skilled in the art, and will not be described further except as necessary for an understanding of the present invention.

Known methods of post-lapping cleaning of the wafers use a series of washing and rinsing steps. A typical post-lapping cleaning process includes:

immersing the wafer in an ultrasonic bath;

removing the wafer from the ultra-sound bath and immersing the wafer in an alkali chemical bath;

rinsing the wafer with purified $H_2O$;

immersing the wafer in three successive alkali chemical baths;

rinsing the wafer in four successive baths of purified $H_2O$;

immersing the wafer in an alkali chemical bath;

rinsing the wafer with purified $H_2O$; and unloading and spin drying the rinsed wafers.

Each of the foregoing steps typically takes an average of about three to four minutes. Overall, the post-lap cleaning of the wafers represents a significant expense, including the consumption of significant volumes of water and alkali chemicals. Known post-lapping cleaning methods also limit the overall wafer production rate, further adding to the final cost of wafer production.

U.S. Pat. No. 5,484,748 to Suzuki et al. teaches a method for storage of wafers in an $H_2O_2$ solution after the acid etching step discussed above. Suzuki addresses the problems attendant in the storage of wafers which have been acid etched, and either in the acid etch step or thereafter, have been treated with an acid or alkali reagent. Suzuki teaches that during processing, wafers must often be stored between processing steps, in some instances for days at a time. Suzuki teaches that the expense and difficulties associated with the storage of wafers in purified water or in clean dry air (having a degree of cleanliness of 100 or more) can be reduced by storing the wafers for up to 120 hours in a solution of between 0.01 to 30% $H_2O_2$ at a temperature between 0–80° C. Suzuki teaches that contamination of wafer surfaces which have been treated with acid or alkali cleaning or etching reagents may thus be avoided while at the same time providing greater flexibility in the manufacturing process. Suzuki does not address, however, the lengthy and expensive process of post-lapping cleaning and passivation of wafers, which represents a significant cost factor and production rate-limiting step.

A need therefore remains for a post-lap cleaning method which is simpler and faster than the current cleaning methods of the prior art, and one which reduces the required number and amount of post lapping cleaning reagents.

SUMMARY OF THE INVENTION

The present invention is embodied in a method for post-lapping cleaning of silicon wafers which reduces the required number and volumes of cleaning reagents required, and which greatly reduces the time required for post-lap cleaning by treating the lapped wafer surfaces to a dilute $H_2O_2$ solution.

It is an object of the present invention to provide a method for post-lap cleaning of silicon wafers which reduces the number of treatment steps required.

It is a second object of the invention to provide a method for post-lap cleaning and oxidation of silicon wafers which reduces the number and volume of reagents required.

It is an additional object of the invention to provide an improved method for post-lap cleaning and oxidation of silicon wafers which produces a uniform, tightly adhered oxide layer atop the cleaned wafer surface.

These and other objects of the invention will be discussed in greater detail by the following description of the preferred embodiments.

DETAILED DESCRIPTION OF THE INVENTION

In a preferred embodiment of the invention, a rod of purified silicon which has been produced by known methods, such as the CZ method, is sawed into wafers. The wafers are then lapped by being supported between rotating iron discs which are weighted to exert several thousand pounds of pressure on the discs. An aqueous suspension of finely divided $Al_2O_3$ in medium filtered water is then injected between the rotating discs. The wafers are lapped in this manner until about 20–60 microns of silicon have been removed from each surface of the wafer. The post-lapping wafer surfaces are covered with the aqueous $Al_2O_3$ lapping compound which also includes silica particles generated by the lapping process.

In the prior art methods, lapping materials such as $Al_2O_3$ slurry and silica remaining on the surfaces of post-lapped wafers are removed using a combined pre-etch clean line and SCI bath process. The process includes the following steps: ultrasonic cleaning, multiple successive $H_2O$ rinses, immersion in an alkali chemical bath, a final $H_2O$ rinse, and spin drying. After spin drying, the wafers are laser marked, alkali cleaned, and acid etched to finally prepare the wafer surface for subsequent processing. Each of the foregoing post-lapping cleaning steps takes approximately three to four minutes. The process as a whole requires a number of aggressive chemical reagents which must be provided, handled and disposed of, all at considerable expense. In addition, the time required for post-lapping cleaning of the wafers results in a limitation on the overall production rate of wafers in a manufacturing facility.

Applicant has discovered that the foregoing prior art post-lapping cleaning steps, i.e. the pre-etch and SCI cleaning processes, can be avoided in its entirely by employing the greatly simplified methods of the present invention. In the present invention, the lapped silicon wafers, the surfaces of which are contaminated with an aqueous slurry of $Al_2O_3$ and silica, are treated with dilute $H_2O_2$ solution, preferably by being immersed in a room temperature bath of $H_2O_2$ for between about 5 and 30 minutes. In the preferred embodiment, a 1–2% solution of $H_2O_2$ is used, although the method can be successfully employed using $H_2O_2$ concentrations of about 0.5–30%. Preferably, the wafers are immersed in a 1% $H_2O_2$ solution for between about 5 and 20 minutes, and most preferably for a period of about 20 minutes. After immersion in the $H_2O_2$ solution, the wafers are air-dried or spin-dried, and are immediately ready, without further post-lapping cleaning, for laser marking, pre-etching cleaning, and acid etching according to prior art methods as described above. The surfaces of wafers thus treated are believed to be covered with a uniform, dense, tightly adhered layer of $SiO_2$ having a thickness of several angstroms. Applicant has found that the methods of the present invention can supplant entirely the post-lapping methods of the prior art in that the surfaces of wafers thus treated can be immediately passed to the steps of laser marking, pre-etching cleaning, and acid etching without further preparation, and with no adverse effects on either yield or quality. The methods of the present invention serve to enhance the production of wafers by eliminating entirely the steps of immersing the wafer in an ultrasonic bath; removing the wafer from the ultrasonic bath and immersing the wafer in an alkali chemical bath; rinsing the wafer with purified $H_2O$; immersing the wafer in three successive alkali chemical baths; rinsing the wafer in four successive baths of purified $H_2O$; immersing the wafer in an alkali chemical bath; and rinsing the wafer with purified $H_2O$. In addition to the equipment, reagent, and disposal cost savings resulting from replacing the foregoing processing steps with method of the present invention, the post lapping cleaning time and the overall wafer manufacturing time are also reduced.

While the invention has been described with reference to the preferred embodiments, those embodiments are intended to be exemplary and not to limit the scope of the following claims.

We claim:

1. A method for producing silicon wafers which comprises the steps of:
    lapping a surface of a silicon wafer with a lapping material;
    cleaning and passivating the lapped wafer surface with a solution consisting essentially of an aqueous hydrogen peroxide solution; and
    drying the wafer surface, the dried wafer surface comprising a passivated contaminant-resistant surface.

2. The method of claim 1 wherein the hydrogen peroxide solution is between about 0 and 80° C.

3. The method of claim 1 wherein the hydrogen peroxide solution is between about 10 and 30° C.

4. The method of claim 1 wherein the aqueous hydrogen peroxide solution comprises between about 0.5 to 30% by weight hydrogen peroxide.

5. The method of claim 1 wherein the aqueous hydrogen peroxide solution comprises between about 0.5 to 5% by weight hydrogen peroxide.

6. The method of claim 1 wherein the aqueous hydrogen peroxide solution comprises between about 1 to 2% by weight hydrogen peroxide.

7. The method of claim 1 wherein the step of cleaning the lapped wafer surface with an aqueous hydrogen peroxide solution comprises applying the aqueous hydrogen peroxide solution to the lapped wafer surface for between about 5 and 20 minutes.

8. A method for cleaning a silicon wafer which consists of the steps of:
    lapping a surface of a silicon wafer with a lapping material;
    cleaning and passivating the lapped wafer surface with a solution consisting essentially of an aqueous hydrogen peroxide solution, the cleaned wafer surface being substantially free of lapping material; and
    drying the wafer surface, the dried wafer surface comprising a passivated contaminant-resistant surface.

9. The method of claim 8 wherein the aqueous hydrogen peroxide solution comprises between about 0.5 to 30% by weight hydrogen peroxide.

10. The method of claim 8 wherein the aqueous hydrogen peroxide solution comprises between about 0.5 to 5% by weight hydrogen peroxide.

11. The method of claim 8 wherein the aqueous hydrogen peroxide solution comprises between about 1 to 2% by weight hydrogen peroxide.

12. The method of claim 1 wherein the step of cleaning the lapped wafer surface with an aqueous hydrogen peroxide solution comprises applying the aqueous hydrogen peroxide solution to the lapped wafer surface for between about 5 and 20 minutes.

13. The method of claim 1 wherein the hydrogen peroxide solution is between about 0 and 80° C.

14. The method of claim 1 wherein the hydrogen peroxide solution is between about 10 and 30° C.

15. A silicon wafer produced by a method including the steps of:
    lapping a surface of a silicon wafer with a lapping material;
    cleaning and passivating the lapped wafer surface by applying an aqueous hydrogen peroxide solution, the cleaned wafer surface being substantially free of lapping material; and
    drying the wafer surface to provide a passivated wafer surface which is resistant to contamination.

16. The method of claim 15 wherein the aqueous hydrogen peroxide solution comprises between about 0.5 to 30% by weight hydrogen peroxide.

17. The method of claim 15 wherein the aqueous hydrogen peroxide solution comprises between about 0.5 to 5% by weight hydrogen peroxide.

18. The method of claim 15 wherein the aqueous hydrogen peroxide solution comprises between about 1 to 2% by weight hydrogen peroxide.

19. The method of claim 11 wherein the hydrogen peroxide solution is between about 0 and 80° C.

20. The method of claim 11 wherein the hydrogen peroxide solution is between about 10 and 30° C.

21. The method of claim 11 wherein the step of cleaning the lapped wafer surface with an aqueous hydrogen peroxide solution comprises applying the aqueous hydrogen peroxide solution to the lapped wafer surface for between about 5 and 20 minutes.

* * * * *